United States Patent
Li et al.

(10) Patent No.: US 9,054,135 B2
(45) Date of Patent: Jun. 9, 2015

(54) METHODS FOR FABRICATING INTEGRATED CIRCUITS WITH A HIGH-VOLTAGE MOSFET

(71) Applicant: GLOBALFOUNDRIES Singapore Pte. Ltd., Singapore (SG)

(72) Inventors: Bing Li, Singapore (SG); Sung Mun Jung, Singapore (SG); Yi Tat Lim, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 39 days.

(21) Appl. No.: 13/955,637

(22) Filed: Jul. 31, 2013

(65) Prior Publication Data

US 2015/0037948 A1 Feb. 5, 2015

(51) Int. Cl.
*H01L 21/336* (2006.01)
*H01L 29/66* (2006.01)

(52) U.S. Cl.
CPC .............................. *H01L 29/66825* (2013.01)

(58) Field of Classification Search
USPC ................................... 438/257; 257/E21.179
See application file for complete search history.

(56) References Cited

U.S. PATENT DOCUMENTS

| | | | |
|---|---|---|---|
| 7,371,631 B2 * | 5/2008 | Sakai et al. | 438/201 |
| 2006/0118854 A1 * | 6/2006 | Lee | 257/315 |
| 2008/0032513 A1 * | 2/2008 | Nagarad et al. | 438/775 |

* cited by examiner

*Primary Examiner* — Matthew Landau
*Assistant Examiner* — Igwe U Anya
(74) *Attorney, Agent, or Firm* — Ingrassia Fisher & Lorenz, P.C.

(57) ABSTRACT

Methods for fabricating integrated circuits are disclosed. In an exemplary embodiment, a method for fabricating an integrated circuit includes forming a silicon material layer over a semiconductor substrate. The method further includes forming a capping layer over the silicon material layer and over the memory gate stack, removing the capping layer from over the memory array region and the high-voltage MOSFET region, forming a second silicon material layer over the capping layer and over the first silicon material layer, and removing the second silicon material layer. The method further includes removing the capping layer from over the first silicon material layer in the logic device region and removing the first and second silicon material layers from the high-voltage MOSFET region. Still further, the method includes forming a photoresist material layer over the memory array region and the logic device region and exposing the semiconductor substrate to an ion implantation process.

14 Claims, 7 Drawing Sheets

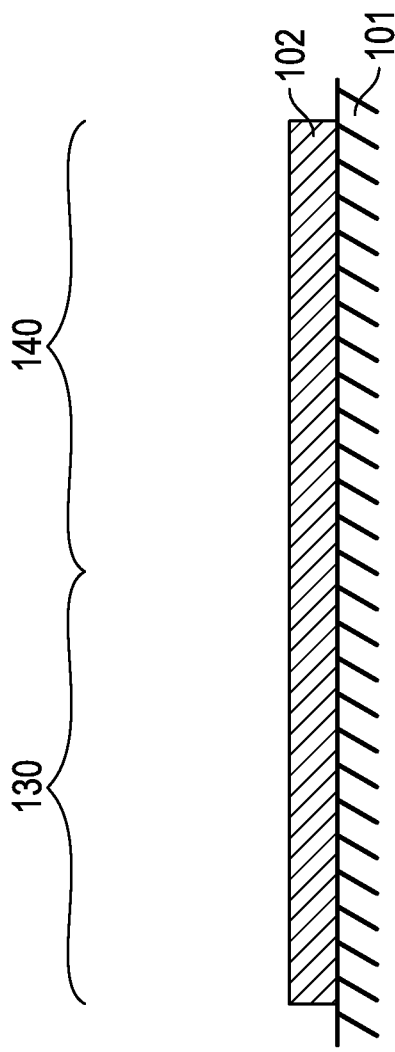
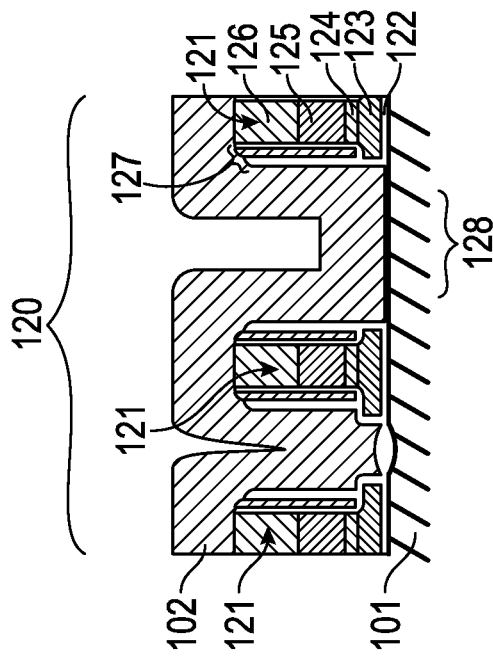
FIG. 1
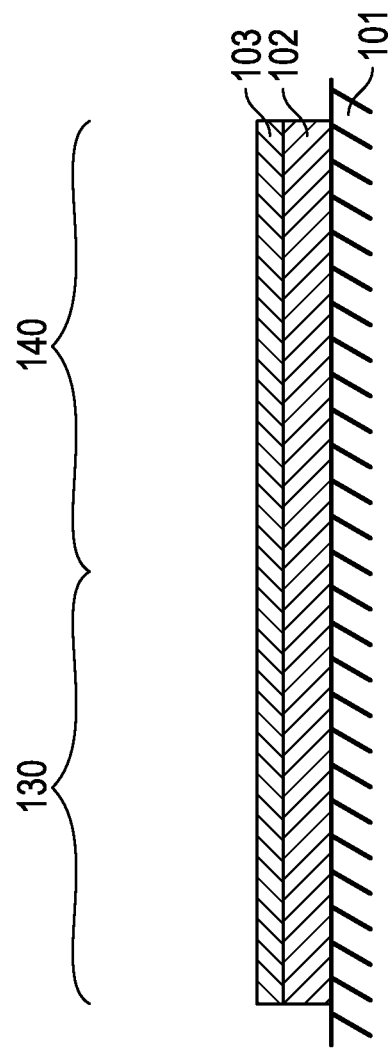
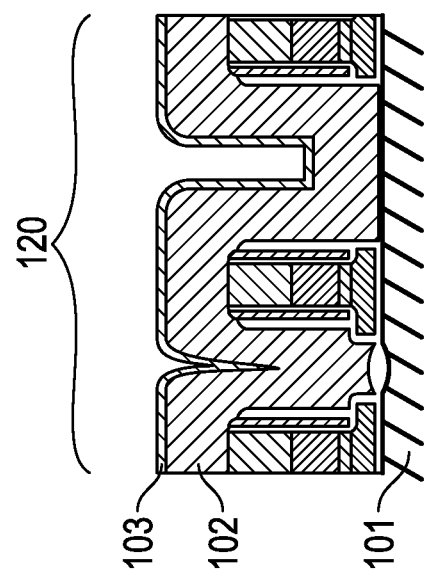
FIG. 2

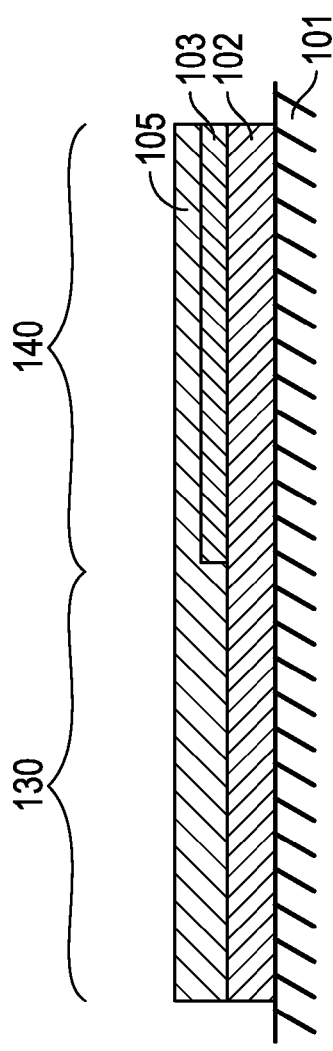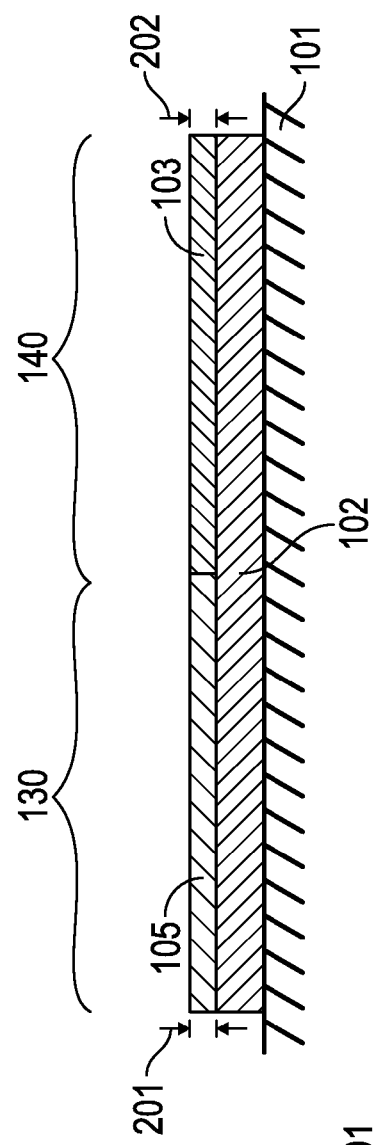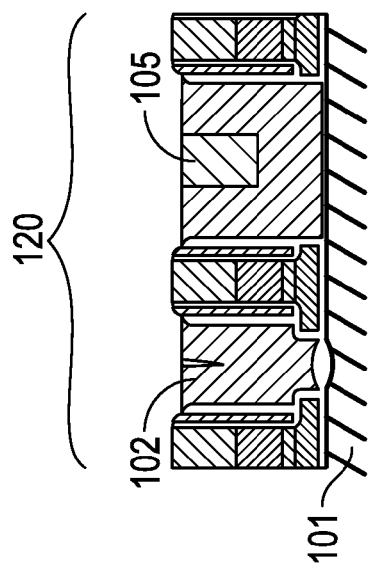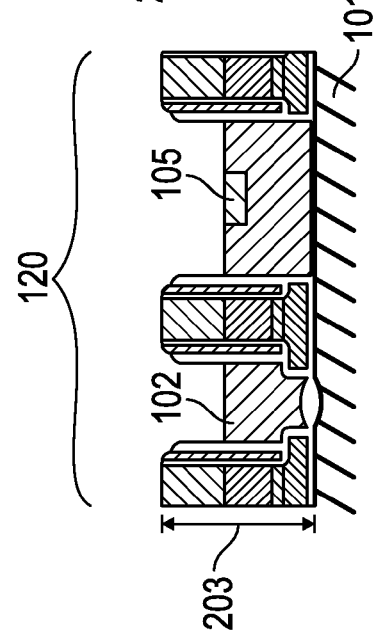
FIG. 5
FIG. 6

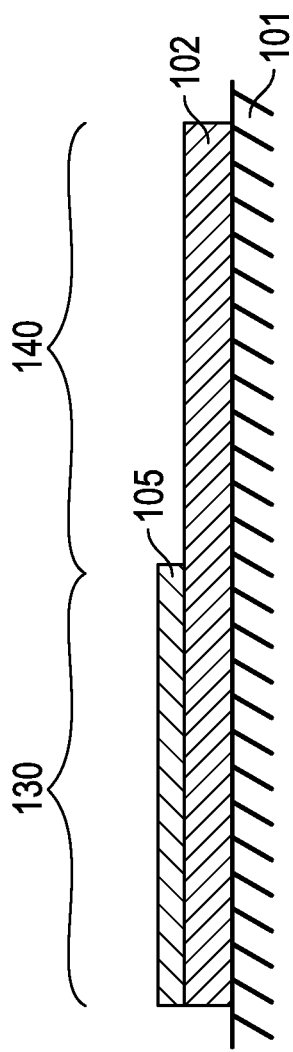
FIG. 7
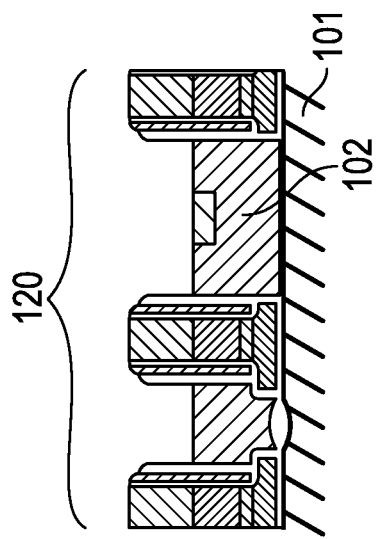
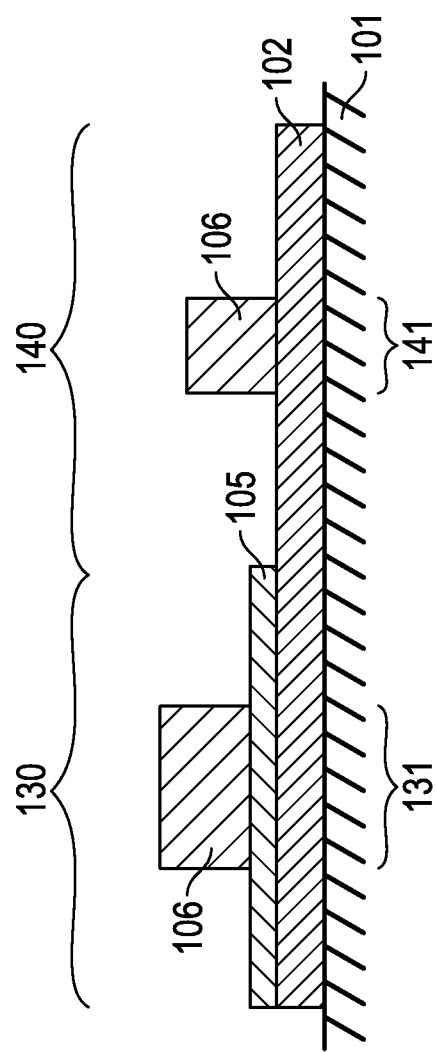
FIG. 8
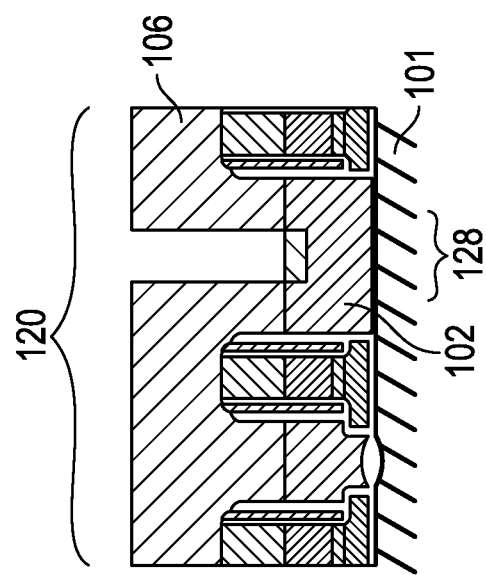

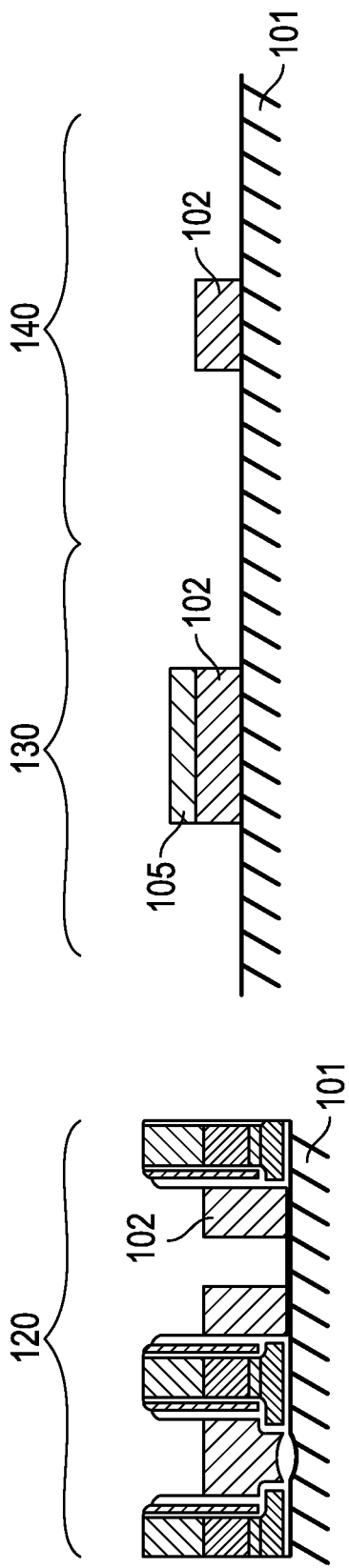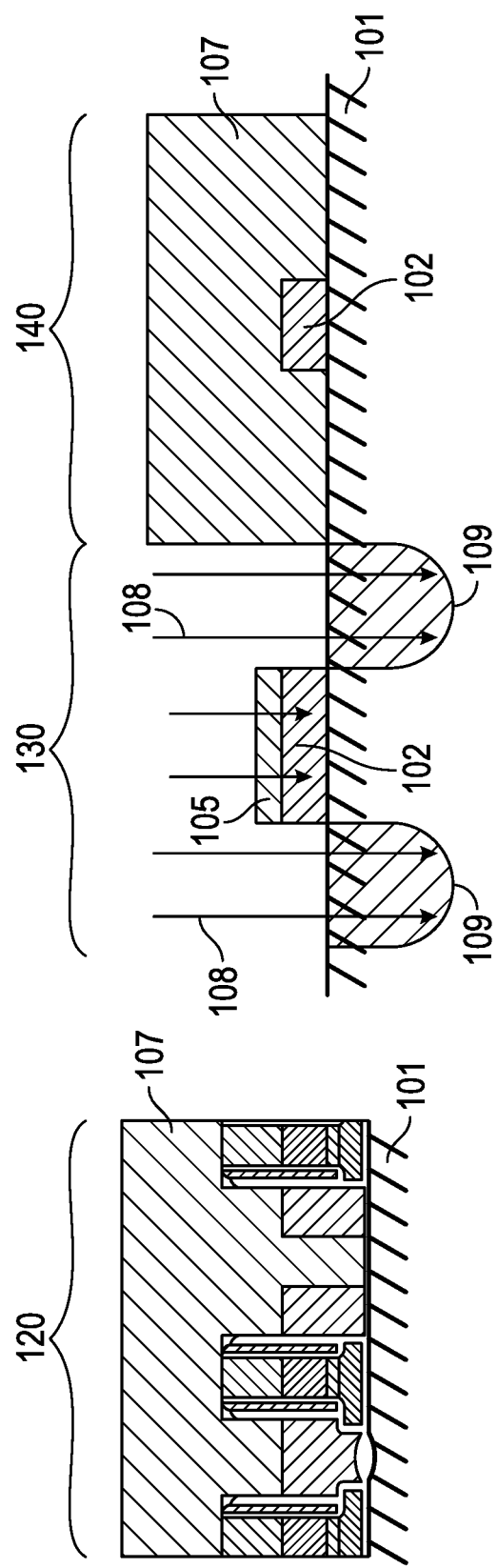

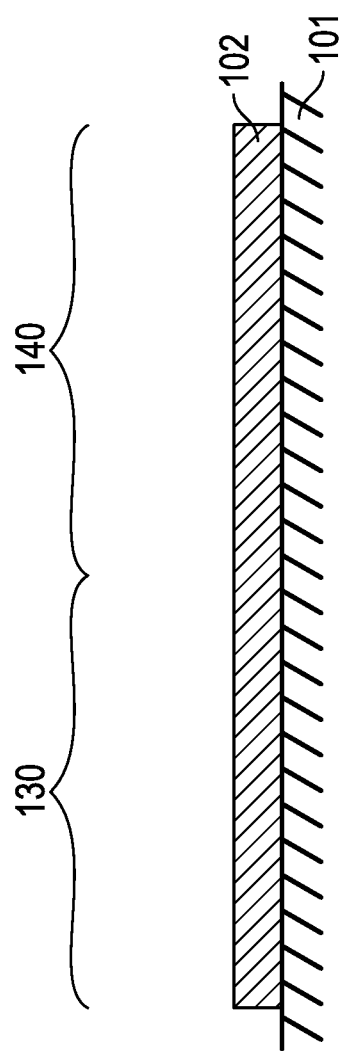
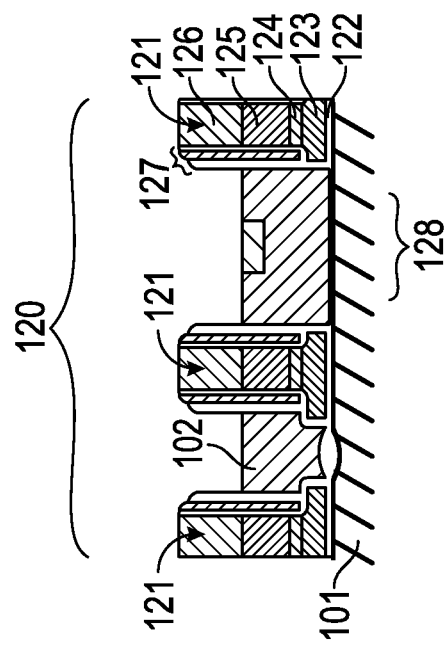
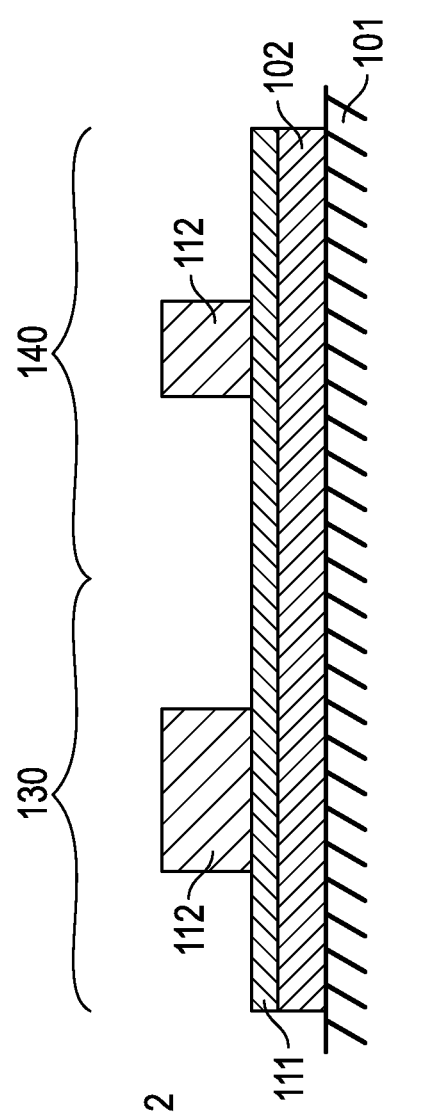
FIG. 11
FIG. 12

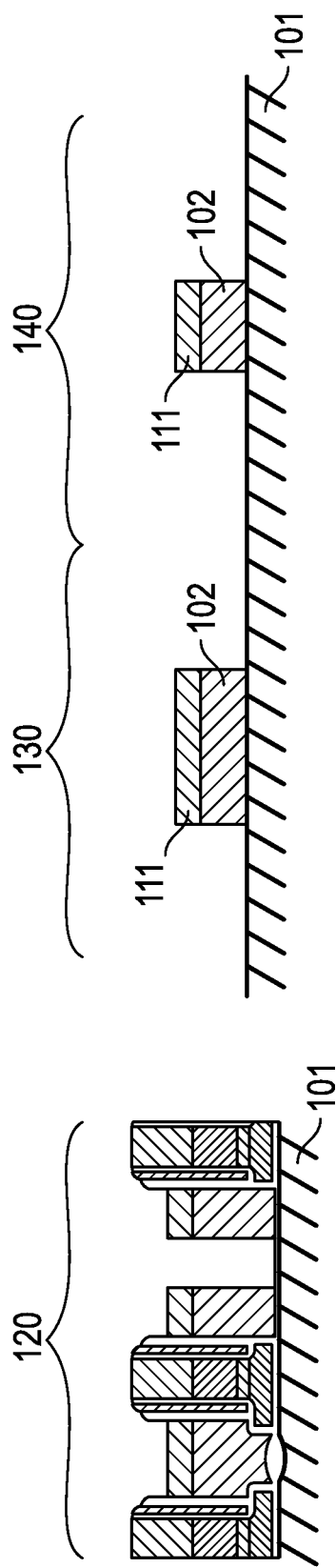
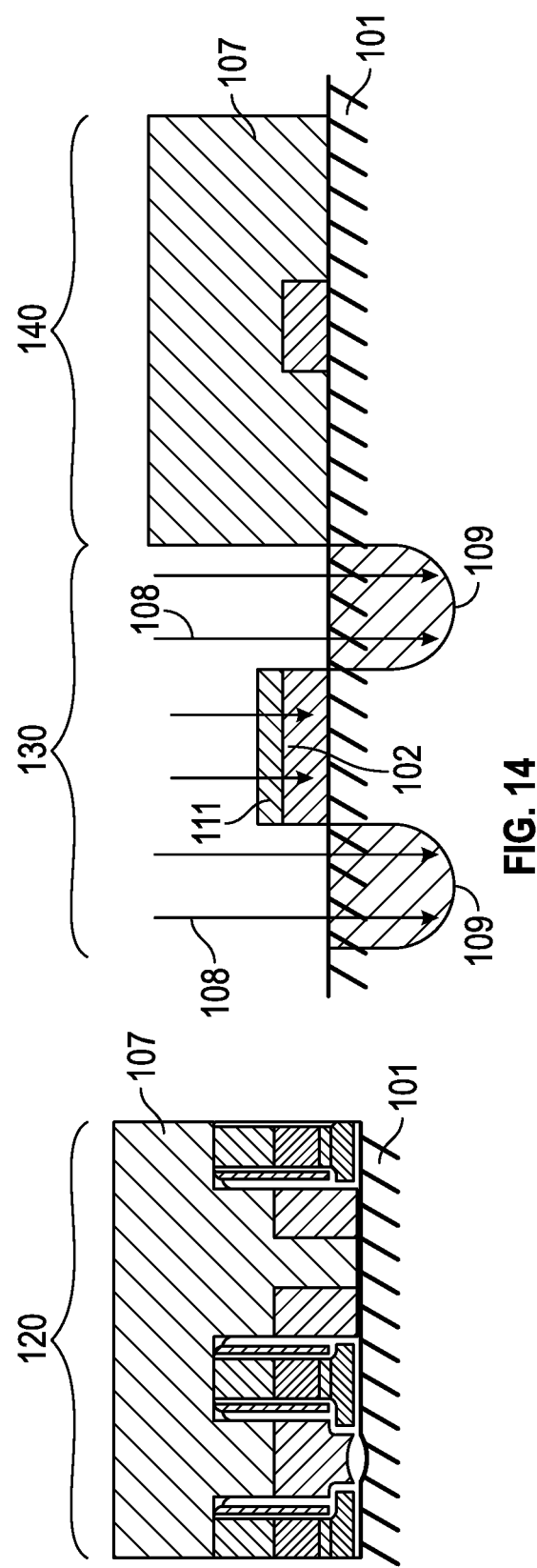

METHODS FOR FABRICATING INTEGRATED CIRCUITS WITH A HIGH-VOLTAGE MOSFET

TECHNICAL FIELD

The present disclosure generally relates to methods for fabricating integrated circuits. More particularly, the present disclosure relates to methods for fabricating integrated circuits with a high-voltage MOSFET.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions between which a current can flow. A control voltage applied to the gate electrode controls the flow of current through a channel between the source and drain regions.

The fabrication of advanced integrated circuits, such as CPUs, storage devices, ASICs (application specific integrated circuits), and the like requires the formation of a large number of circuit elements in a given chip area according to a specified circuit layout. In fact, many modern integrated circuit chips may have one or more "logic regions" where primarily logic circuits or logic devices are made, one or more "memory regions or arrays" that primarily contain memory devices, and one or more "high-voltage" MOSFETs to improve device performance. Although the logic devices, memory devices, and high-voltage MOSFETs are often formed on the same chip and frequently share common materials, such devices do have fundamental structural differences, and they are often formed at different times during a particular process flow that is performed to form the completed integrated circuit device.

The basic structures of the logic devices, memory devices, and high-voltage MOSFETs are fabricated by forming various layers of material and thereafter patterning those layers of material using known photolithography and etching processes. Often, the basic layer "stack" for the memory devices is formed prior to fabricating the gate electrodes for the logic regions and high-voltage MOSFET regions of the device. In contrast, due to some structural similarities, the logic regions and high-voltage MOSFET regions may be fabricated, at least in part, concurrently. Thus, the process designer is often faced with the challenge of ensuring that process steps employed in the fabrication of one device do not harm other devices that are previously or concurrently fabricated.

Over recent years, there has been a constant drive to reduce the physical size of various consumer electronic products that employ integrated circuits. The demand for smaller consumer products with greater capability has resulted in the scaling or reduction in the physical size of integrated circuit devices that are employed in such consumer products. The reduction in size of the integrated circuits has been achieved by, among other things, reducing the physical size of the various semiconductor devices, e.g., the transistors, and by greatly increasing the density of such transistors on a given area of a semiconducting substrate or chip.

With reduction in physical size, however, there is a greater likelihood that the processes employed in the fabrication of one device of the integrated circuit may adversely affect the prior or concurrent fabrication of other devices due to increased proximity of the devices. In one example, it is known that the fabrication of high-voltage MOSFETs requires a "lightly-doped drain" (LDD) ion implantation step prior to the fabrication of the gate structure to ensure proper electron flow in the channel below the gate. In order to prevent ion implantation directly into the channel region during the process, a polysilicon "masking" layer is often employed over the channel region. Due to scale limitations, however, in integrated circuit designs where a logic device is disposed adjacent to the high-voltage MOSFET device, the thickness of the polysilicon layer is limited. In particular, in small scale devices, the thickness of the polysilicon masking layer may be limited such that the thickness is insufficient to adequately block ion implantation into the channel region of the high-voltage MOSFET. The presence of dopant ions in the channel may, in turn, result in degraded device performance.

Accordingly, it is desirable to provide improved methods for fabricating high-voltage MOSFETs. Additionally, it is desirable to provide methods for fabricating high-voltage MOSFETs on an integrated circuit that further includes one or more memory arrays or logic devices in close proximity thereto that do not suffer degraded performance as a result of concurrent device fabrication process limitations. Furthermore, other desirable features and characteristics of the present disclosure will become apparent from the subsequent detailed description and the appended claims, taken in conjunction with the accompanying drawings and the foregoing technical field and background.

BRIEF SUMMARY

Methods for fabricating integrated circuits with a high-voltage MOSFET are disclosed. In an exemplary embodiment, a method for fabricating an integrated circuit includes forming a silicon material layer over a semiconductor substrate. The semiconductor substrate includes a high-voltage MOSFET region, a logic device region, and a memory array region. The memory array region has formed on the semiconductor substrate a memory gate stack. The method further includes forming a capping layer over the silicon material layer and over the memory gate stack, removing the capping layer from over the memory array region and the high-voltage MOSFET region but not from over the logic device region of the integrated circuit, forming a second silicon material layer over the capping layer and over the first silicon material layer, and removing the second silicon material layer in an amount such that a thickness of the second silicon material layer over the first silicon material layer in the high-voltage MOSFET region is substantially equal to a thickness of the capping layer over the first silicon material layer in the logic device region. The method further includes removing the capping layer from over the first silicon material layer in the logic device region and removing the first and second silicon material layers from the high-voltage MOSFET region except in an area overlying a channel region of the high-voltage MOSFET region. Still further, the method includes forming a photoresist material layer over the memory array region and the logic device region and exposing the semiconductor substrate to a dopant ion implantation process.

In another exemplary embodiment, a method for fabricating an integrated circuit includes forming a first silicon material layer over a semiconductor substrate. The semiconductor substrate includes a high-voltage MOSFET region, a logic device region, and a memory array region. The memory array region has formed on the semiconductor substrate a memory gate stack. The method further includes forming a first capping layer over the first silicon material layer and over the memory gate stack, removing the first capping layer from over the memory array region but not from over the high-voltage MOSFET region and the logic device region of the integrated circuit, forming a second silicon material layer over the first capping layer and over the first silicon material layer, and removing the second silicon material layer in an amount such that the second silicon material layer is completely removed from over the high-voltage MOSFET region and the logic device region. The method further includes removing the first capping layer from over the first silicon material layer in the high-voltage MOSFET region and the logic device region, forming a second capping layer over the first silicon material layer in the high-voltage MOSFET region and the logic device region, and removing the first silicon material layer and the second capping layer from the high-voltage MOSFET region except in an area overlying a channel region of the high-voltage MOSFET region. Still further, the method includes forming a photoresist material layer over the memory array region and the logic device region and exposing the semiconductor substrate to a dopant ion implantation process.

BRIEF DESCRIPTION OF THE DRAWINGS

The present disclosure will hereinafter be described in conjunction with the following drawing figures, wherein like numerals denote like elements, and wherein:

FIGS. 1-10 illustrate, in cross section, integrated circuit structures and methods for fabricating integrated circuit structures in accordance with various embodiments contemplated herein; and FIGS. 11-14 illustrate, in cross section, integrated circuit structures and methods for fabricating integrated circuit structures in accordance with further embodiments contemplated herein.

DETAILED DESCRIPTION

Figure 3:
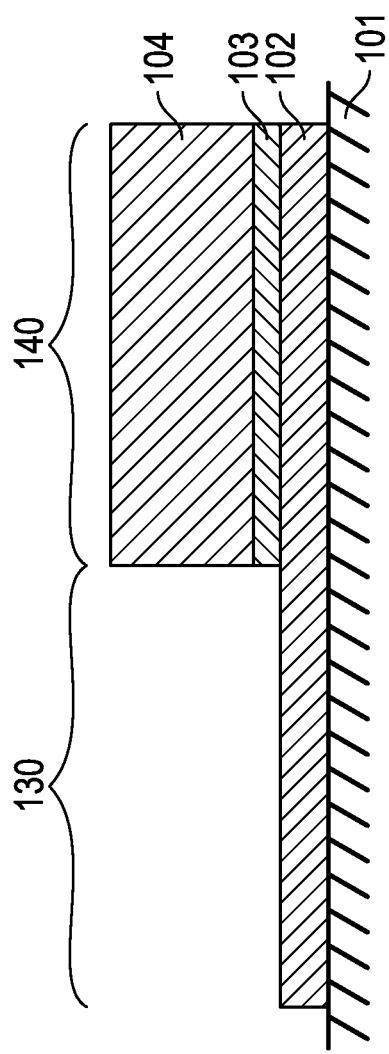

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

The present disclosure provides improved methods for the fabrication of integrated circuits that include high-voltage MOSFET(s), and in particular integrated circuits that include a high-voltage MOSFET, a logic device, and a memory array in close proximity to one another, such as on the same layout block of the integrated circuit. The methods described herein employ an additional "dummy" polysilicon layer or an additional "capping" silicon oxide layer that is deposited over the channel region of the high-voltage MOSFET in order to provide additional masking protection to the channel region during a subsequent LDD ion implantation step. As such, the present disclosure provides methods for fabricating integrated circuits with high-voltage MOSFETs that do not suffer from degraded device performance due to the unintended implantation of dopant ions in the channel region thereof as has been encountered in some prior art integrated circuits.

For the sake of brevity, conventional techniques related to integrated circuit device fabrication may not be described in detail herein. For example, the illustrated embodiments show the integrated circuits at a stage of fabrication where the gate stacks of the memory array device have been previously formed using techniques know in the art because, as noted above, memory devices are often formed prior to the fabrication of the logic and high-voltage MOSFET devices. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details. As such, the embodiments described herein, again for the sake of brevity, commence discussion after the gate stacks for the memory array have been formed.

In an embodiment, a method of fabricating an integrated circuit includes forming a first silicon material layer, for example a polycrystalline silicon (hereinafter "polysilicon") 0 layer, over a semiconductor substrate, the semiconductor substrate including a high-voltage MOSFET region, a logic device region, and a memory array region, the memory array region having formed on the semiconductor substrate a memory gate stack. As illustrated in cross section in FIG. 1, a semiconductor substrate 101 includes a memory array region 120, a high-voltage MOSFET region 130, and a logic device region 140. Although in the Figures regions 130 and 140 are illustrated adjacent to one another and region 120 is illustrated separate from regions 130 and 140, it will be appreciated that integrated circuits are provided in numerous different designs, and as such the particular configuration illustration in the Figures is not to be understood as limiting. The semiconductor substrate 101 is preferably a silicon substrate having a (100) surface crystal orientation. The term "silicon substrate" is used herein to encompass the relatively pure silicon materials typically used in the semiconductor industry as well as silicon admixed with other elements such as germanium, carbon, and the like. A silicon substrate may be a bulk silicon wafer (as illustrated), or may be a thin layer of silicon on an insulating layer (commonly know as silicon-on-insulator or SOI) that, in turn, is supported by a carrier wafer. Alternatively, the semiconductor substrate 101 can be germanium, gallium arsenide, or other semiconductor material.

At the point of fabrication depicted in FIG. 1, the basic layer stack of a plurality of floating-gate memory devices 121 has been formed in the memory array region 120 using known techniques and materials. In the illustrative example depicted in FIG. 1, each memory device 121 includes a gate insulation layer 122, a floating gate 123, another layer(s) of insulating material 124, a control gate 125, and a capping layer 126. One or more sidewall spacer layers 127 may be disposed along sidewall regions of the memory devices 121. A word-line (WL) region 128 may separate certain of the memory devices 121, as is known in the art. The memory devices 121 are intended to be representative in nature and do not include all features of a completed memory device, such as various doped regions, conductive contacts, etc. The layer stack for the memory devices 121 may be formed by forming the various layers of material and thereafter performing one or more etching processes to define the basic layer stack for the memory devices 121. In one illustrative embodiment, the gate insulation layer 122 may include, for example, silicon dioxide, which may be formed by either a thermal growth process or by a deposition process, such as a chemical vapor deposition (CVD) process, and it may have a thickness of about 5 nm to about 10 nm. The floating gate 123 and the control gate 125 may include a variety of materials such as, for example, polysilicon, etc. The floating gate 123 and the control gate 125 need not be made of the same material, although they may be. In one illustrative embodiment, both the floating gate 123 and the control gate 125 may be formed of polysilicon, they may be formed by performing a chemical vapor deposition (CVD) or a furnace process, and they each may have a thickness that ranges from about 80 nm to about 100 nm. The insulating layer 124 may include one or more layers of insulating material such as, for example a multi-layer stack of oxide-nitride-oxide (ONO), and it may have an overall thickness of about 10 nm. In other cases, different materials and different numbers of layers of materials may be employed. Thus, the particular details of the memory devices 121, the materials used in their construction, and the manner in which they are made should not be considered a limitation of the present disclosure.

As further illustrated in FIG. 1, a uniformly thick and conformal first polysilicon layer 102 is formed by CVD on the semiconductor substrate 101, including over the plurality of floating gate memory devices 121. The first polysilicon layer 102 is deposited to a thickness of about 100 nm to about 150 nm. In an example, low-pressure CVD (LPCVD) is employed for forming first polysilicon layer 102, as this technique provides a suitable conformal coating. First polysilicon layer 102 is deposited by the pyrolysis of a silicon-bearing gas such as silane and dichlorosilane, for example, at a temperature of about 600° C. to about 800° C. in an atmospheric pressure system or reduced pressure system at a low pressure of about 13.3 Pa to about 26.6 Pa.

The exemplary method of fabricating the integrated circuit continues with forming a capping layer, for example a silicon oxide layer, over the silicon material layer and over the memory gate stack. With reference now to FIG. 2, a capping layer 103 is formed overlying first polysilicon layer 102. Capping layer 103 may include a deposited silicon oxide, silicon nitride, or silicon oxynitride, polycrystalline silicon, amorphous silicon, amorphous carbon (a-C), a carbon-doped silica (SiCOH), or another material suitable for providing an etch-resistant covering over the first polysilicon layer 102. Capping layer 103 may be blanket-deposited using, for example, a plasma enhanced chemical vapor deposition (PECVD), low pressure chemical vapor deposition (LPCVD), or other chemical vapor deposition (CVD) process. In an example, capping layer 103 includes silicon oxide, having a thickness of about 50 nm to about 1 micron ($\mu$m), and for example about 100 nm to about 250 nm.

Subsequent to depositing the capping layer, the exemplary method includes removing the capping layer from over the memory array region and the high-voltage MOSFET region but not from over the logic device region of the integrated circuit. As shown in FIG. 3, a photoresist layer 104 is formed over the logic device region 140, but not over the memory array region 120 or the high-voltage MOSFET 130 region utilizing conventional lithographical processing. For example, as illustrated in FIG. 3, the photoresist layer 104 is deposited over the capping layer 103. The photoresist layer 104 may then be exposed to an image pattern and treated with a developing solution to form pattern openings within photoresist layer 104. An anisotropic dry etch, such as a reactive ion etch, can then be performed utilizing a chemistry selected to etch capping layer 103 to remove the areas of capping layer 103 exposed through the pattern openings, i.e., the areas over memory array region 120 and high-voltage MOSFET region 130, but not over logic device region 140. The remaining photoresist is then removed. While generally described above as a single layer of photoresist, it will be readily appreciated that photoresist layer 104 (and any other layer or structure referred to as a "photoresist" herein) may assume the form of a lithographical stack, such as a tri-layer lithographical stack including a photoresist layer, an optical planarization layer ("OPL"), and an anti-reflective coating ("ARC") layer. In this case, the photoresist layer may first be lithographically patterned, a first etch may then be performed to transfer the pattern to the underlying ARC and OPL layers, and then a second etch may be performed to transfer the pattern from the ARC and OPL layers as previously described. Any remaining portion of the lithographical stack (e.g., the optical planarization layer) may then be removed by "ashing" (exposure to heat to oxidize the remaining portions) to yield the structure shown in FIG. 3.

Figure 4:
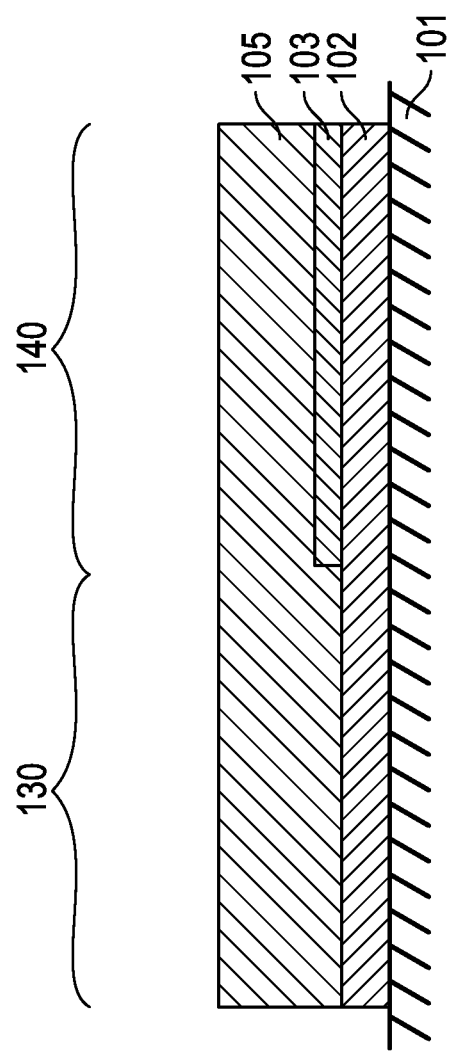

The exemplary method continues with forming a second silicon material layer over the capping layer and over the first silicon material layer. As shown in FIG. 4, a second, "dummy" polysilicon layer 105 is provided as a uniformly thick and conformal polysilicon layer over the first polysilicon layer 102 in the memory array region 120 and the high-voltage MOSFET region 130, and over the capping layer 103 in the logic device region 103. The thickness of the second polysilicon layer 105 is from about 100 nm to about 150 nm LPCVD may be used to form second polysilicon layer 105, as noted above regarding the formation of layer 102.

The exemplary method continues with removing the second silicon material layer in an amount such that a thickness of the second silicon material layer over the first silicon material layer in the high-voltage MOSFET region 130 is substantially equal to a thickness of the capping layer over the first silicon material layer in the logic device region. Removing the second silicon material layer may be accomplished in one or more steps. For example, as shown in FIGS. 5 and 6, the second polysilicon layer 105 is removed first using chemical mechanical planarization (CMP), followed by etching. CMP is performed to remove a first portion of the second polysilicon layer (FIG. 5), followed by an etching process that is selective to the capping layer 103 such that the thickness, illustrated by arrows 201 of the second polysilicon layer 105 over the first polysilicon layer 102 in the high-voltage MOSFET region 130 is substantially equal to the thickness, illustrated by arrows 202 of the capping layer 103 over the first polysilicon layer 102 in the logic device region 140 (FIG. 6). With regard to the memory array region 120, the combined CMP/etching results in the removal of the first and second polysilicon layers 102, 105 below a height, illustrated by arrows 203 of the floating gate stacks 121. This etch may be performed by, for example, plasma or reactive ion etching (RIE) using chemistries based upon carbon trifluoride/oxygen ($CHF_3/O_2$) to etch silicon nitride, and $CHF_3$ or carbon tetrafluoride ($CF_4$) to etch silicon oxide or oxynitride, ozone ($O_3$), $O_2$, ammonia ($NH_3$) to etch a-C, hydrogen bromide/oxygen ($HBr/O_2$) to etch silicon, or octafluorocyclobutane ($C_4F_8$) and $CF_4$ to etch SiCOH.

Thereafter, the exemplary method includes removing the capping layer from over the first polysilicon layer in the logic device region. As illustrated in FIG. 7, the capping layer 103 is removed from the logic device region in a step that is performed using, for example, the application of a suitable etching chemistry, such as a wet etching chemistry that is selective to polysilicon. In one example, dilute hydrofluoric acid (dHF) may be used as a suitable wet etchant to etch the remaining portion of capping layer 103.

Subsequently, the exemplary method continues with removing the first and second silicon material layers from the high-voltage MOSFET region 130 except in an area overlying a channel region of the high-voltage MOSFET region. As shown in FIGS. 8 and 9, a photoresist layer 106 is formed over portions of the memory array region 120, the high-voltage MOSFET region 130, and the logic device region 140. In the memory array region 120, the photoresist layer 106 is formed over the entire region except for the word-line region 128 of the memory array. In the high-voltage MOSFET region 130, the photoresist layer 106 is formed over the first and second polysilicon layers 102, 105 in an area of the high-voltage MOSFET region that correspond to a channel region 131 of the MOSFET that will subsequently be formed. Further, in the logic device region 140, the photoresist layer 106 is formed over the first polysilicon layer 102 in an area of the logic device region that corresponds to a channel region 141 of the logic device that will subsequently be formed. The photoresist layer 106 is formed utilizing conventional lithographical processing. For example, the photoresist layer 106 is deposited and then exposed to an image pattern and treated with a developing solution to form pattern openings within photoresist layer 106 as shown in FIG. 8 and described above. An anisotropic dry etch, such as a reactive ion etch, can then be performed utilizing a chemistry selected to etch the first and second polysilicon layers 102, 105 to remove the areas of the first and second polysilicon layers 102, 105 exposed through the pattern openings, but not over the word-line region 128, the high-voltage MOSFET channel region 131, or the logic device channel region 141, as shown in FIG. 9. The remaining photoresist is then removed.

In the exemplary method, a photoresist material layer is thereafter formed over the memory array region and the logic device region, using the above-described photoresist material patterning and etching procedure. That is, a photoresist layer 107 is deposited and then is exposed to an image pattern and treated with a developing solution to form pattern openings within photoresist layer 106, particularly over the high-voltage MOSFET region 130 but not over either the memory array region 120 or the logic device region 140, as shown in FIG. 10.

Thereafter, the exemplary method continues with exposing the semiconductor substrate to a dopant ion implantation process. For example, LDD implants may be performed as part of the formation of source and drain regions 109 for the high-voltage MOSFET device to be formed. As further shown in FIG. 10, the semiconductor substrate 101 is exposed to an ionizing environment with an ionic dopant species (indicated by arrows 108) that is directed downward towards the semiconductor substrate 101. First and second polysilicon layers 102, 105, being formed over the channel region 131 of the high-voltage MOSFET region, provide an ion-implantation "mask" to protect the channel region 131 from the ionic dopant species being implanted therein. As opposed to the single polysilicon layer (102) that remains over channel region 141 of the logic device region 140, the thicker, "dual" polysilicon implantation mask (formed of polysilicon layers 102 and 105) provides increased protection against ion implantation for the relatively high-energy ionic species that are used in the LDD implantation process for high-voltage MOSFETs. Illustrative N-type dopant materials that may be introduced in the LDD implant process include, for example, arsenic, phosphorus, etc. The LDD implant process may be performed at a dopant dose and an energy level appropriate for the device under construction, i.e., the high-voltage MOSFET.

Fabrication of the integrated circuit may thereafter continue with further processing steps that can be performed to complete the fabrication the devices, as are well-known in the art. Further steps conventionally include, for example, the formation of metals gates, forming an insulating layer overlying the metal gates, the formation of contacts (formed by depositing a photoresist material layer over the insulating layer, lithographic patterning, etching to form contact voids, and depositing a conductive material in the voids to form the contacts), and the formation of one or more patterned conductive layers across the device above the insulating layer, among many others. The subject matter disclosed herein is not intended to exclude any subsequent processing steps to form and test the completed integrated circuit as are known in the art. Furthermore, with respect to any of the process steps described above, one or more heat treating and/or annealing procedures can be employed after the deposition of a layer, as is commonly known in the art.

FIGS. 11-14 illustrate another exemplary embodiment in accordance with the present disclosure. FIG. 11 corresponds to FIG. 7 of the previously described embodiment, except that, in the presently described embodiment, no portion of the second polysilicon layer 105 remains over the first polysilicon layer 102 in either the high-voltage MOSFET region 130 or the logic device region 140. This can be accomplished, for example, by performing the step illustrated in FIG. 3 by removing the capping layer 103 from over the memory array 120 only, and not from over either the MOSFET region 130 or the logic device region 140.

The exemplary method of fabricating the integrated circuit continues with forming a capping layer, for example a silicon oxide layer, over the silicon material layer and over the memory gate stack. With reference now to FIG. 12, a further capping layer 111 is formed overlying first polysilicon layer 102. Further capping layer 111 may include a deposited silicon oxide, silicon nitride, or silicon oxynitride, polycrystalline silicon, amorphous silicon, amorphous carbon (a-C), a carbon-doped silica (SiCOH), or another material suitable for providing an etch-resistant covering over the first polysilicon layer 102. Further capping layer 111 may be blanket-deposited using, for example, a plasma enhanced chemical vapor deposition (PECVD), low pressure chemical vapor deposition (LPCVD), or chemical vapor deposition (CVD) process. In an example, further capping layer 111 includes silicon oxide, having a thickness of about 50 nm to about 1 μm, and for example about 100 nm to about 250 nm.

The exemplary method thereafter continues in FIGS. 12, 13, and 14 as described above with regard to FIGS. 8, 9, and 10, except that that "masking" layer that remains to protect the channel region 131 of the high-voltage MOSFET region 130 is the combined capping layer 111 and the first polysilicon layer 102, as opposed to the previously described embodiment wherein the masking layer was formed of the remaining portions of both the first and second polysilicon layers 102, 105. In this embodiment, by combining a silicon oxide capping layer with a polysilicon layer, the resulting implantation mask provides increased protection against ion implantation for the relatively high-energy ionic species that are used in the LDD implantation process for high-voltage MOSFETs.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit comprising:

forming a first silicon material layer over a semiconductor substrate, the semiconductor substrate including a high-voltage MOSFET region, a logic device region, and a memory array region, the memory array region having formed on the semiconductor substrate a memory gate stack;

forming a capping layer over the first silicon material layer and over the memory gate stack;

removing the capping layer from over the memory array region and the high-voltage MOSFET region but not from over the logic device region of the integrated circuit;

forming a second silicon material layer over the capping layer and over the first silicon material layer;

removing the second silicon material layer in an amount such that a thickness of the second silicon material layer over the first silicon material layer in the high-voltage MOSFET region is substantially equal to a thickness of the capping layer over the first silicon material layer in the logic device region;

removing the capping layer from over the first silicon material layer in the logic device region;

removing the first and second silicon material layers from the high-voltage MOSFET region except in an area overlying a channel region of the high-voltage MOSFET region;

masking the memory array region and the logic device region; and exposing the semiconductor substrate to a dopant ion implantation process.

2. The method of claim 1, wherein forming the first silicon material layer over the semiconductor substrate comprises forming the first silicon material layer over a semiconductor substrate that comprises a floating-gate memory gate stack.

3. The method of claim 1, wherein forming the first silicon material layer comprises depositing a polysilicon layer.

4. The method of claim 1, wherein forming the capping layer comprises depositing a silicon oxide capping layer.

5. The method of claim 1, wherein removing the capping layer comprises forming a patterned photoresist layer over the logic device region of the semiconductor substrate but not over the memory array region or the high-voltage MOSFET region and etching the capping layer from over the memory array region and the high-voltage MOSFET region.

6. The method of claim 1, wherein forming a second silicon material layer comprises forming a dummy polysilicon layer.

7. The method of claim 1, wherein removing the second silicon material layer comprises removing the second silicon material layer using chemical mechanical planarization.

8. The method of claim 7, wherein removing the second silicon material layer further comprises removing the second silicon material layer using an etching process.

9. The method of claim 1, wherein removing the capping layer comprises removing the capping layer using a wet etching process.

10. The method of claim 1, wherein removing the first and second silicon material layers from the high-voltage MOSFET region comprises forming a patterned photoresist layer over the area overlying the channel region of the high-voltage MOSFET region and etching the first and second silicon material layers from the high-voltage MOSFET region except in the area overlying the channel region of the high-voltage MOSFET region.

11. The method of claim 10, further comprising removing the first and second silicon material layers from a word-line region of the memory array region.

12. The method of claim 11, further comprising removing the first silicon material layer from the logic device region except in an area overlying a channel region of the logic device region.

13. The method of claim 1, wherein exposing the semiconductor substrate to the dopant ion implantation process comprises forming a lightly-doped drain (LDD) region in the high-voltage MOSFET region.

14. A method for fabricating an integrated circuit comprising:

depositing a first polysilicon layer over a semiconductor substrate, the semiconductor substrate including a high-voltage MOSFET region, a logic device region, and a memory array region, the memory array region having formed on the semiconductor substrate a floating-gate memory stack;

depositing a silicon oxide capping layer over the first polysilicon layer and over the memory gate stack;

removing the capping layer from over the memory array region and the high-voltage MOSFET region but not from over the logic device region of the integrated circuit;

depositing a second polysilicon layer over the capping layer and over the first polysilicon layer;

removing, by a combination of chemical mechanical planarization and etching, the second polysilicon layer in an amount such that a thickness of the second polysilicon layer over the first polysilicon layer in the high-voltage MOSFET region is substantially equal to a thickness of the capping layer over the first polysilicon layer in the logic device region;

wet etching the capping layer from over the first silicon material layer in the logic device region;

removing the first and second silicon material layers from the high-voltage MOSFET region except in an area overlying a channel region of the high-voltage MOSFET region;

removing the first and second polysilicon layers from a word-line region of the memory array region;

removing the first polysilicon layer from the logic device region except in an area overlying a channel region of the logic device region;

depositing a photoresist material layer over the memory array region and the logic device region; and forming a lightly-doped drain (LDD) region in the high-voltage MOSFET region by exposing the semiconductor substrate to a dopant ion implantation process.

* * * * *